(12) United States Patent
Litwin et al.

(10) Patent No.: US 7,098,741 B2
(45) Date of Patent: Aug. 29, 2006

(54) MONOLITHICALLY INTEGRATED POWER AMPLIFIER DEVICE

(75) Inventors: Andrej Litwin, Danderyd (SE); Paul Andersson, Sollentuna (SE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/882,868

(22) Filed: Jul. 1, 2004

(65) Prior Publication Data

US 2005/0046484 A1 Mar. 3, 2005

(30) Foreign Application Priority Data

Aug. 27, 2003 (SE) .................................. 0302297

(51) Int. Cl.
*H03F 3/68* (2006.01)
(52) U.S. Cl. ........................ 330/297; 330/300; 330/311
(58) Field of Classification Search ................ 330/297, 330/300, 302, 310, 311
See application file for complete search history.

(56) References Cited

U.S. PATENT DOCUMENTS

| | | | | |
|---|---|---|---|---|
| 4,535,304 | A | * | 8/1985 | Bura ........................... 330/300 |
| 6,163,220 | A | | 12/2000 | Schellenberg ............... 330/295 |
| 6,166,598 | A | | 12/2000 | Schlueter ..................... 330/127 |
| 6,204,731 | B1 | | 3/2001 | Jiang et al. .................. 330/310 |
| 6,476,678 | B1 | * | 11/2002 | Kolluri et al. ............... 330/297 |
| 6,617,931 | B1 | * | 9/2003 | Theus et al. ................. 330/310 |
| 2002/0036541 | A1 | | 3/2002 | Buer ........................... 330/295 |
| 2002/0055220 | A1 | | 5/2002 | Soderbarg et al. .......... 438/234 |

FOREIGN PATENT DOCUMENTS

| | | |
|---|---|---|
| DE | 196 04 239 A1 | 8/1996 |
| DE | 100 35 065 A1 | 2/2001 |

OTHER PUBLICATIONS

Bengtsson, Olof et al.; "Small-Signal and Power Evaluation of Novel BiCMOS-Compatible Short-Channel LDMOS Technology"; IEEE Transactions on Microwave Theory and Techniques, vol. 51, No. 3, Mar. 2003.
Bouisse, Gerard; "Latest Advances in High Power SI MMIC", IEEE Eumw, GaAs Symposium, Sep. 24-28, 2001, London, 2 Pages (front and back), Sep. 2001.
Bouisse, Gerard; "0.2 dB Gain Ripple—20W—WCDMA Silicon MMIC", IEEE EuMC-ECWT Symposium 2001 (month unknown), 2 pages, 2001.

* cited by examiner

*Primary Examiner*—Steven J. Mottola
(74) *Attorney, Agent, or Firm*—Baker Botts L.L.P.

(57) ABSTRACT

A monolithically integrated microwave amplifier device, comprises an input for receiving a microwave signal, a first power amplifier stage (11; 32) having an input coupled to receive the microwave signal, an impedance matching network (16; 39) coupled to an output of the first power amplifier stage, a second power amplifier stage (12; 33) having an input coupled to the impedance matching network, and an output for outputting the microwave signal after having been amplified by the first and second power amplifier stages, wherein the first power amplifier stage is optimized to be supplied with a first supply voltage (13; 35), which is essentially lower than a second supply voltage (14; 36), with which the second power amplifier stage is optimized to be supplied. Preferably, the second stage is an end stage based on an LDMOS transistor, and the first stage is a driver stage based on a bipolar transistor.

18 Claims, 2 Drawing Sheets

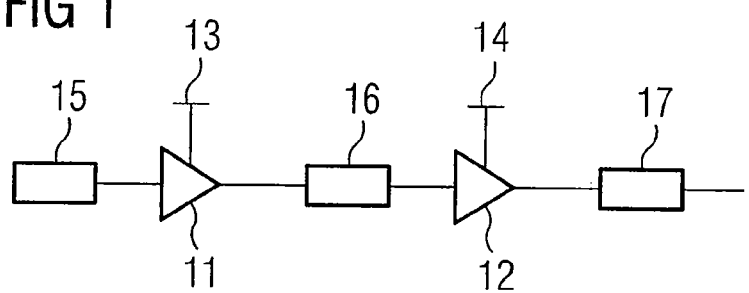
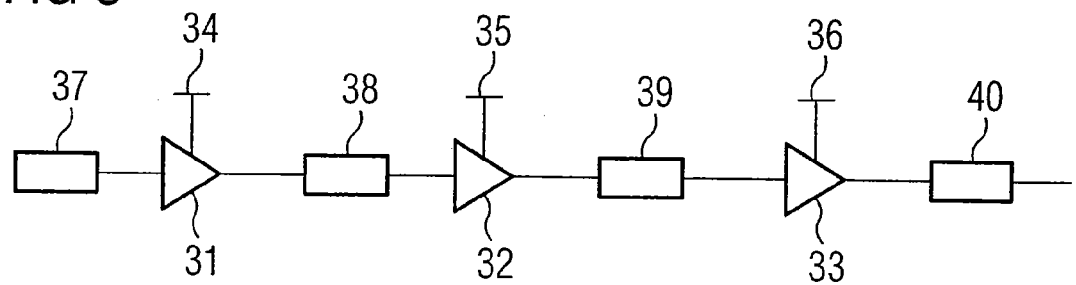

MONOLITHICALLY INTEGRATED POWER AMPLIFIER DEVICE

PRIORITY

This application claims priority to Swedish application no. 0302297-7 filed Aug. 27, 2003.

TECHNICAL FIELD OF THE INVENTION

The present invention generally relates to the field of integrated circuit technology, and more specifically the invention relates to a monolithically integrated microwave frequency high power amplifier device.

DESCRIPTION OR RELATED ART AND BACKGROUND OF THE INVENTION

As the wireless communication business continues to grow, there are great demands in further cost reduction, and to use semiconductor manufacturing processes and component techniques that can handle very high-volumes during the short product cycles of many of the new devices. The ever-increasing market for microwave power amplifiers in PCS, CDMA and WCDMA systems requires low-cost ease-of-use technology, which can provide high-power and good linearity performance.

LDMOS started replacing bipolar devices in base station applications 3–4 years ago and has for multiple reasons become the leading technology for base station power amplifier applications. It has high gain and shows excellent back-off linearity. For the output power amplifier however, discrete devices are still dominating.

Integrated power amplifiers in LDMOS silicon technology, moderately integrated as MMIC's (microwave monolithic integrated circuits), have only recently found its way from the research and development laboratories, see e.g. G. Bouisse, "Latest Advances in High Power Si MMIC", IEEE Eumw, GaAs symposium 2001, and G. Bouisse, "0.2 db gain ripple-20W-WCDMA Si MMIC", IEEE EuMC-ECWT symposium 2001.

The integration of LDMOS transistors into RF BiCMOS processes without affecting other devices is described in the published U.S. patent application No. 20020055220 A1, and in O. Bengtsson, A. Litwin, and J. Olsson: "Small-Signal and Power Evaluation of Novel BiCMOS-Compatible Short Channel LDMOS Technology", IEEE Transactions on Microwave Theory and Techniques, Vo. 51, No. 3, March 2003. This opens a way to low cost and more efficient linear integrated radio frequency power amplifiers with multiple amplification steps on the very same die.

SUMMARY OF THE INVENTION

MMIC power amplifiers for radio base stations require wide bandwidth efficient impedance matching networks between the amplifier stages due to mismatch between the output impedance of a driver stage and the input impedance of a following amplifier stage. The high transformation ratio causes problems to achieve stable wideband operation and lowers the gain, thus lowering the overall efficiency, due to high loaded Q value of matching network. The transformation ratio mismatch could be reduced by lowering the supply voltage to the driver step, but such solution results in turn in no optimum use of the transistors since they are designed to have the best performance at a certain supply voltage. Also the necessary inductors and capacitors included in the matching networks occupy a substantial die area, increasing the cost of the device and causing power loss.

Accordingly, it is an object of the present invention to provide a monolithically integrated microwave frequency high power amplifier device, which overcomes the problems and limitations associated with the prior art devices.

It is a particular object of the invention to provide such a device, which puts less demand on any inter-stage impedance matching circuits used in the device.

It is a further object of the invention to provide such a device, which can have higher efficiency and power gain and which can show more favorable linearity properties than prior art MMIC power amplifiers.

It is yet a further object of the invention to provide such a device, which can be fabricated in a documented BiCMOS process without the need of additional processing steps.

These objects can be attained by a monolithically integrated microwave frequency high power amplifier device, comprising input means for receiving a microwave frequency signal, a first power amplifier stage having an input and an output, the input of the first power amplifier stage being coupled to receive the microwave signal, a second power amplifier stage having an input and an output, the input of the second power amplifier stage being coupled to receive the microwave frequency signal after having been amplified by the first power amplifier stage, and an output for outputting the microwave frequency signal after having been amplified by the first and second power amplifier stages, wherein the first power amplifier stage is optimized to be supplied with a first supply voltage, the second power amplifier stage is optimized to be supplied with a second supply voltage, and the first supply voltage is essentially lower than the second supply voltage.

These object can also be attained by a monolithically integrated microwave frequency high power amplifier device, comprising input means for receiving a microwave frequency signal, a first power amplifier stage having an input and an output, the input of the first power amplifier stage being coupled to receive the microwave signal, the first power amplifier stage is optimized to be supplied with a first supply voltage, a second power amplifier stage having an input and an output, the input of the second power amplifier stage being with the output of the first power amplifier stage, the second power amplifier stage is optimized to be supplied with a second supply higher than the first supply voltage, and an output for outputting the microwave frequency signal coupled with the output of the second power amplifier.

The first power amplifier stage may comprise a first transistor, and the second power amplifier stage may comprise a second transistor, the first and second transistors being of different type. The first transistor can be a low voltage bipolar transistor and the second transistor can be a high voltage LDMOS transistor. The amplifier device can be a two-stage amplifier device, in which the first power amplifier stage is a driver stage and the second power amplifier stage is an end stage. The amplifier device can be a three-stage amplifier device, in which the first power amplifier stage is a driver stage and the second power amplifier stage is an end stage, and a third power amplifier stage is provided having an input and an output, the input of the third power amplifier stage being coupled to receive the microwave signal before being received by the first power amplifier stage, and the output being coupled to feed the microwave frequency signal towards the first power amplifier stage after having been amplified by the third power amplifier stage. The third power amplifier stage can be optimized to be supplied with a third supply voltage, which is essentially lower than the first supply voltage. The third power amplifier stage may comprise a third transistor, which is a low voltage NMOS or PMOS transistor. The third power amplifier stage may comprise a third transistor, which is a low voltage NMOS or PMOS transistor. An impedance matching network can be interconnected between the output of the first power amplifier stage and the input of the second power amplifier stage. The output impedance of the first power amplifier stage can be similar to the input impedance of the second power amplifier stage. The output of the first power amplifier stage can be directly connected to the input of the second power amplifier stage. The output of the first power amplifier stage can be connected to the input of the second power amplifier stage via a DC blocking capacitor only. An impedance matching network can be interconnected between the output of the third power amplifier stage and the input of the first power amplifier stage. The output impedance of the third power amplifier stage may be similar to the input impedance of the first power amplifier stage; and the output of the may be similar to the input impedance of the first power amplifier stage; and the output of the third power amplifier stage may be directly connected to the input of the first power amplifier stage. The output of the third power amplifier stage can be connected to the input of the first power amplifier stage via a DC blocking capacitor only. The input means may comprise an input impedance matching network.

A monolithically integrated microwave frequency high power amplifier device of the present invention comprises a first power amplifier stage and a second power amplifier stage. A microwave frequency signal is received at the input of the first power amplifier stage, is amplified by the first and second power amplifier stages, and is output at the output of the second power amplifier stage. The first power amplifier stage is optimized to be supplied with a first supply voltage and said second power amplifier stage is optimized to be supplied with a second supply voltage, wherein the first supply voltage is lower, preferably considerably lower, than the second supply voltage.

Generally, for an n stage monolithically integrated microwave frequency high power amplifier device of the present invention, the supply voltages V1, V2, ..., Vn, with which the respective amplifier stages 1, 2, ..., n are optimized to be supplied, follow the relation $$V1 < V2 < \ldots < Vn$$

where n is a positive integer, and the amplifier stages are numbered in an increasing order from the input to the output.

In a preferred embodiment of the invention an input or driver stage of the integrated power amplifier device is based on a low voltage bipolar transistor and an end stage of the integrated power amplifier device is based on a high voltage LDMOS transistor.

The combination of a low voltage driver stage based on e.g. a bipolar transistor and a high voltage end stage based on e.g. an LDMOS power transistor results in close impedance matching between the stages. Hereby, an impedance matching network located between the two stages is more stable for process and temperature variations over a wider frequency range. This may also lead to a more easily matched inter-stage network with fewer components. In the ideal case no impedance matching at all between the stages may be necessary. In such instance costly die area is saved and the power loss is decreased.

Also, simulations have been performed to compare an inventive two-stage bipolar-LDMOS MMIC power amplifier device with a conventional two-stage LDMOS-LDMOS MMIC power amplifier device, the results of which show higher efficiency and power gain and better linearity properties for the inventive bipolar-LDMOS MMIC power amplifier device.

The necessary low and high voltage transistors and other devices to manufacture MMIC power amplifiers are easily achievable in radio frequency BiCMOS processes, such as those disclosed in the above-identified published U.S. patent application No. 20020055220 A1, and the article by O. Bengtsson et al., the contents of which being hereby incorporated by reference.

Furthermore, such approach leads to an attractive variety of circuit design options otherwise not easily available in specialized LDMOS processes. Such circuit design options can involve bias, temperature control, linearization circuits, e.g. based on digital or analog pre-distortion, and digital interfaces.

Additional characteristics and advantages of the invention will be evident from the detailed description of preferred embodiments of the present invention given hereinafter and the accompanying FIGS. 1–3, which are given by way of illustration only, and thus are not limitative of the present invention.

BRIEF DESCRIPTION OF THE DRAWINGS

FIG. 1 illustrates schematically a monolithically integrated two-stage power amplifier device according to a preferred embodiment of the present invention.

FIG. 3 illustrates schematically a monolithically integrated three-stage power amplifier device according to a further preferred embodiment of the present invention.

DETAILED DESCRIPTION OF PREFERRED EMBODIMENTS

Figure 2:
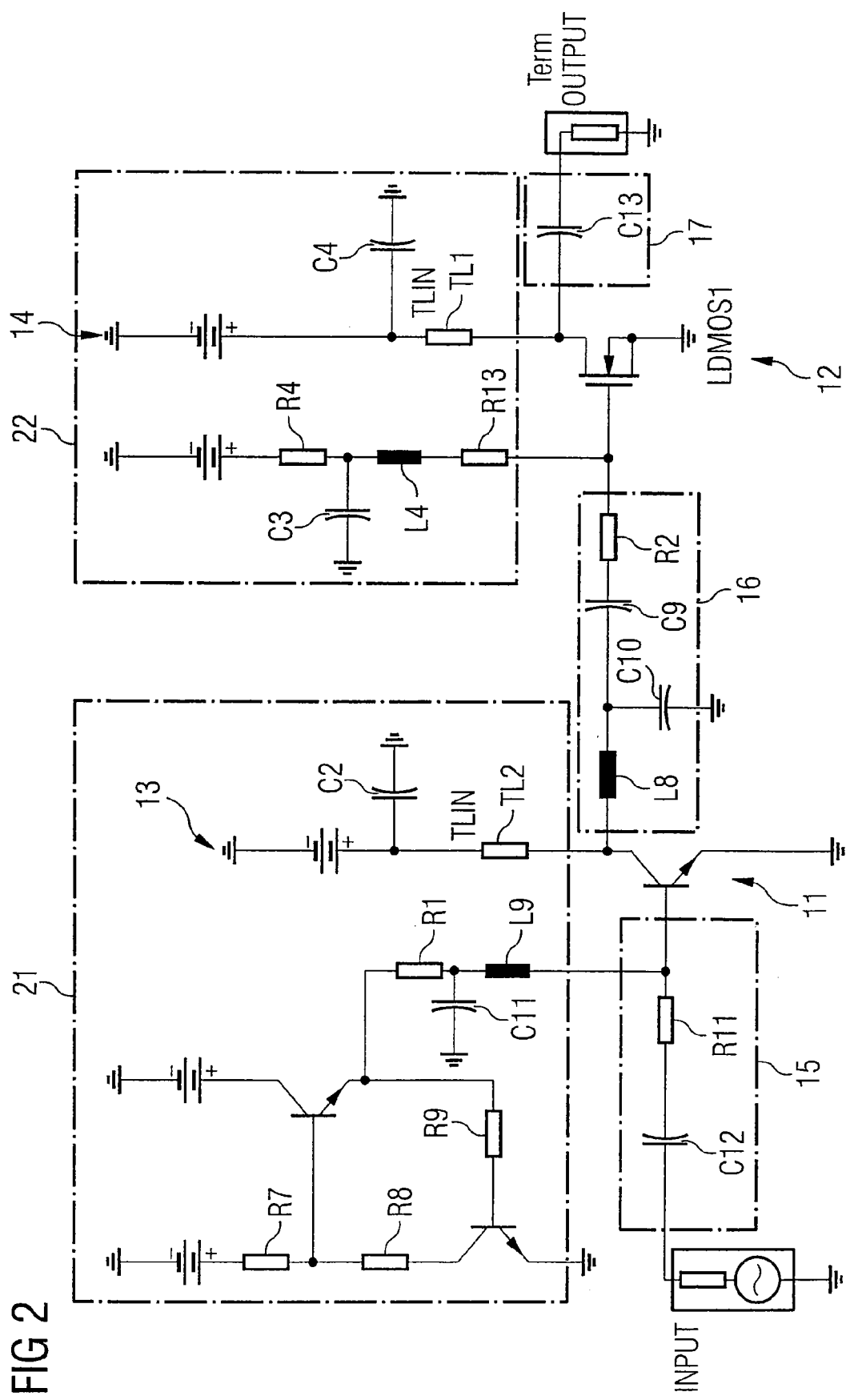
FIG. 2 is a detailed circuit schematic of the power amplifier device of FIG. 1.

In FIG. 1 a monolithically integrated two-stage microwave frequency high power amplifier device according to a preferred embodiment of the present invention is schematically illustrated.

The monolithically integrated power amplifier device comprises a first power amplifier stage 11 and a second power amplifier stage 12 connected in series. The first power amplifier stage 11, being referred to as a driver stage, is coupled to receive and subsequently amplify a microwave signal, and the second power amplifier stage 12, being referred to as an end stage, is coupled to receive the microwave frequency signal after having been amplified by the driver stage 11, and to further amplify the microwave frequency signal.

According to the present invention the driver stage 11 is optimized to be supplied with a first supply voltage, schematically indicated at 13, whereas the end stage 12 is optimized to be supplied with a second supply voltage, schematically indicated at 14. The first supply voltage is lower than the second supply voltage dependent on the input characteristics of the end stage.

Preferably, the driver stage 11 comprises a low voltage bipolar transistor, whereas the end stage 12 comprises a high voltage LDMOS transistor.

Further, the monolithically integrated power amplifier device comprises advantageously an input impedance matching network 15 located at the input of the power amplifier device, an inter-stage impedance matching network 16 located between the two amplifier stages 11, 12. An output impedance matching network 17 located at the output of the power amplifier device is preferably located on a circuit board outside of the monolithically integrated power amplifier due to the large size of such a network.

In the ideal case wherein the output impedance of the driver stage 11 is identical with the input impedance of the end stage 12 no impedance matching at all between the stages may be necessary, and the output of the driver stage 11 can be directly connected to the input of the end stage 12 (not illustrated). However, it is preferred to at least have a DC blocking capacitor interconnected between the amplifier stages 11, 12.

FIG. 2 is a detailed circuit schematic of the power amplifier device of FIG. 1. In the circuit, R denotes a resistor, L denotes an inductor, and C denotes a capacitor. Further, 21 denotes a bias network for biasing of the driver stage 11, and 22 denotes a bias network for biasing of the end stage 12. The bipolar transistor 11 of the driver stage is optimized to be supplied with supply voltage of about 3 V, whereas the MOS transistor 12 of the end stage is optimized to be supplied with supply voltage of about 12 V.

The end stage 12 is designed to give best linearity performance over a wide dynamic range at the above supply voltage. This is accomplished by presenting it with the desired impedances from the low frequency terminations up to the 3rd harmonic terminations. The biasing conditions have also been examined to give best linear and power efficient performance. The drive stage 11 is designed in Class A and to drive the end stage 12 over its full dynamic range and not to limit the overall linearity.

The properties of the drive stage 11 include the optimized supply voltage of about 3 V to give an output impedance in the vicinity of the required input impedance for the end stage 12 at the selected operating frequency. This results ultimately in a loaded Q that is much lower compared to a two-stage design using only LDMOS transistors. The relationship between Q and the bandwidth B is $$B = \frac{f_0}{Q_L}$$

where $f_0$ is the fundamental operating frequency.

Simulations have been performed to compare the inventive two-stage bipolar-LDMOS MMIC power amplifier device of FIGS. 1–2 with a conventional two-stage LDMOS-LDMOS MMIC power amplifier device. Both designs were optimized to produce highest possible efficiency at −40 dBc for 3rd order intermodulation products as a benchmark comparison. In the comparison of the loaded Q for the inter-stage impedance matching network 16, the inventive bipolar-LDMOS amplifier device had a factor of 3.25 lower Q value than the conventional LDMOS-LDMOS configuration. The inventive bipolar-LDMOS power amplifier had at the given linearity benchmark over 20% higher efficiency and 6 dB higher overall power gain than the conventional LDMOS-LDMOS configuration.

In FIG. 3 a monolithically integrated three-stage power amplifier device according to a further preferred embodiment of the present invention is schematically shown.

The amplifier device comprises first, second, and third power amplifier stages 31, 32, 33, each having an individual power supply 34, 35, 36. A device input impedance matching network 37, a device output impedance matching network 40, as well as two inter-stage impedance matching networks 38 and 39 are provided.

The first, second, and third power amplifier stages 31, 32, 33 are optimized to be supplied with respective supply voltages V1, V2, V3 fulfilling the criterion:

$$V1<V2<V3$$

where V1 is the optimized supply voltage of the first amplifier stage 31, i.e. the input amplifier stage, V2 is the optimized supply voltage of the second amplifier stage 32, i.e. the intermediate amplifier stage, and V3 is the optimized supply voltage of the third amplifier stage 33, i.e. the output amplifier stage.

Conveniently, the first power amplifier stage 31 is based on a low voltage NMOS or PMOS transistor, whereas the second power amplifier stage 32 is based on a low voltage bipolar transistor, and the third power amplifier stage 33 is based on a high voltage LDMOS transistor.

In the ideal case no impedance matching at all between the stages may be necessary, and thus each of the inter-stage impedance matching networks 38 and 39 can be dispensed with. Alternatively, each of the inter-stage impedance matching networks 38 and 39 is replaced by a respective simple DC blocking capacitor interconnected between the respective amplifier stages.

Generally, an integrated microwave power amplifier device is designed on a single silicon die, preferably using BiCMOS technology, combining several amplification stages and inter-stage impedance matching circuits and possibly an input impedance matching circuit. Different amplifier stages, numbered 1, 2, ..., n from the input to the output of the integrated microwave power amplifier device, have different supply voltages V1, V2, ..., Vn, for which the respective stages are optimized, fulfilling the criterion:

$$V1<V2< \ldots <Vn$$

in order to reduce output and input impedance differences between adjacent amplifier stages. This reduction in the necessary transformation ratio increases the bandwidth of the inter-stage matching network and thus of the power amplifier device.

In the case that a transformation ratio is close to one, i.e. an output impedance of an amplifier stage is similar to the input impedance of a following power amplifier stage, no impedance matching circuit between these two stages will be necessary, thus removing most of the area consuming passive devices, such as capacitors and inductors, in the radio frequency path. In this case the frequency bandwidth of the cascaded power amplifier device will be limited by the transistor high frequency properties and not by the inter-stage matching networks.

We claim:

1. A monolithically integrated microwave frequency high power amplifier device for a radio base station, comprising:
    input means for receiving a microwave frequency signal,
    a first power amplifier stage having an input and an output, the input of said first power amplifier stage being coupled to receive said microwave signal,
    a second power amplifier stage having an input and an output, the input of said second power amplifier stage being coupled to receive said microwave frequency signal after having been amplified by said first power amplifier stage, and
    an output for outputting said microwave frequency signal after having been amplified by said first and second power amplifier stages, wherein said first power amplifier stage is optimized to be supplied with a first supply voltage, said second power amplifier stage is optimized to be supplied with a second supply voltage, and said first supply voltage is substantially lower than said second supply voltage.

2. The amplifier device of claim 1, wherein said first power amplifier stage comprises a first transistor, and said second power amplifier stage comprises a second transistor, said first and second transistors being of different type.

3. The amplifier device of claim 2, wherein said first transistor is a low voltage bipolar transistor and said second transistor is a high voltage LDMOS transistor.

4. The amplifier device of claim 2, wherein said amplifier device is a two-stage amplifier device, in which said first power amplifier stage is a driver stage and said second power amplifier stage is an end stage.

5. The amplifier device of claim 1, wherein said amplifier device is a three-stage amplifier device, in which said first power amplifier stage is a driver stage and said second power amplifier stage is an end stage, and a third power amplifier stage is provided having an input and an output, the input of said third power amplifier stage being coupled to receive said microwave signal before being received by said first power amplifier stage, and the output being coupled to feed said microwave frequency signal towards said first power amplifier stage after having been amplified by said third power amplifier stage.

6. The amplifier device of claim 5, wherein said third power amplifier stage is optimized to be supplied with a third supply voltage, which is essentially lower than said first supply voltage.

7. The amplifier device of claim 5, wherein said third power amplifier stage comprises a third transistor, which is a low voltage NMOS or PMOS transistor.

8. The amplifier device of claim 6, wherein said third power amplifier stage comprises a third transistor, which is a low voltage NMOS or PMOS transistor.

9. The amplifier device of claim 1, wherein an impedance matching network is interconnected between the output of said first power amplifier stage and the input of said second power amplifier stage.

10. The amplifier device of claim 1, wherein the output impedance of said first power amplifier stage is similar to the input impedance of said second power amplifier stage.

11. The amplifier device of claim 10, wherein the output of said first power amplifier stage is directly connected to the input of said second power amplifier stage.

12. The amplifier device of claim 1, wherein the output of said first power amplifier stage is connected to the input of said second power amplifier stage via a DC blocking capacitor only.

13. The amplifier device of claim 5, wherein an impedance matching network is interconnected between the output of said third power amplifier stage and the input of said first power amplifier stage.

14. The amplifier device of claim 5, wherein the output impedance of said third power amplifier stage is similar to the input impedance of said first power amplifier stage; and the output of said third power amplifier stage is directly connected to the input of said first power amplifier stage.

15. The amplifier device of claim 5, wherein the output of said third power amplifier stage is connected to the input of said first power amplifier stage via a DC blocking capacitor only.

16. The amplifier device of claim 1, wherein said input means comprises an input impedance matching network.

17. A monolithically integrated microwave frequency high power amplifier device for a radio base station, comprising:

input means for receiving a microwave frequency signal, a first power amplifier stage having an input and an output, the input of said first power amplifier stage being coupled to receive said microwave signal, said first power amplifier stage is optimized to be supplied with a first supply voltage, a second power amplifier stage having an input and an output, the input of said second power amplifier stage being with the output of said first power amplifier stage, said second power amplifier stage is optimized to be supplied with a second supply voltage being substantially higher than said first supply voltage, and an output for outputting said microwave frequency signal coupled with the output of said second power amplifier.

18. A monolithically integrated microwave frequency high power amplifier device, comprising:

input means for receiving a microwave frequency signal, a first power amplifier stage having an input and an output, the input of said first power amplifier stage being coupled to receive said microwave signal, a second power amplifier stage having an input and an output, the input of said second power amplifier stage being coupled to receive said microwave frequency signal after having been amplified by said first power amplifier stage, and an output for outputting said microwave frequency signal after having been amplified by said first and second power amplifier stages, wherein said first power amplifier stage is optimized to be supplied with a first supply voltage, said second power amplifier stage is optimized to be supplied with a second supply voltage, and said first supply voltage is lower than said second supply voltage;

wherein said amplifier device is a three-stage amplifier device, in which said first power amplifier stage is a driver stage and said second power amplifier stage is an end stage, and a third power amplifier stage is provided having an input and an output, the input of said third power amplifier stage being coupled to receive said microwave signal before being received by said first power amplifier stage, and the output being coupled to feed said microwave frequency signal towards said first power amplifier stage after having been amplified by said third power amplifier stage; and wherein said third power amplifier stage is optimized to be supplied with a third supply voltage, which is essentially lower than said first supply voltage.

* * * * *